United States Patent [19]

Kohl et al.

[11] 4,389,291

[45] Jun. 21, 1983

[54] PHOTOELECTROCHEMICAL PROCESSING OF INP-TYPE DEVICES

[75] Inventors: Paul A. Kohl; Frederick W. Ostermayer, Jr.; Catherine Wolowodiuk, all of Chatham, N.J.

[73] Assignee: Bell Telephone Laboratories, Incorporated, Murray Hill, N.J.

[21] Appl. No.: 275,245

[22] Filed: Jun. 19, 1981

[51] Int. Cl.³ .................................................. C25F 3/12
[52] U.S. Cl. .............................. 204/129.3; 204/129.4; 204/129.95
[58] Field of Search ............ 204/129.3, 129.4, 129.75, 204/129.95, 129.6

[56] References Cited

U.S. PATENT DOCUMENTS 3,706,645  12/1972  Lasser ............................... 204/129.3
4,283,259  8/1981   Melcher et al. ................... 204/129.3
4,351,706  9/1982   Chappell et al. .................. 204/129.3

OTHER PUBLICATIONS

Lubzens, D., "Photoetching of InP Mesas for Production of mm-Wave Transferred-Electron Oscillators", *Elec. Letters*, pp. 171–172.

*Primary Examiner*—Donald R. Valentine
*Attorney, Agent, or Firm*—Walter G. Nilsen

[57] ABSTRACT

A process is described for photoelectrochemically etching n-type indium phosphide and closely related compound semiconductors such as indium gallium arsenide and indium gallium arsenide phosphide. Such a process is advantageous because the etching is confined to where light is incident to the surface of the semiconductor. In addition, the shape of the configuration etched out of the semiconductor can be controlled by the light incident on the surface of the semiconductor. For example, undercutting can be minimized by use of parallel rays incident on the surface of the semiconductor to be etched.

16 Claims, 4 Drawing Figures

PHOTOELECTROCHEMICAL PROCESSING OF INP-TYPE DEVICES

TECHNICAL FIELD

The invention is a photoelectrochemical procedure for etching n-type InP and related compound semiconductors.

BACKGROUND OF THE INVENTION

Great advancements have been made in semiconductor technology in the last few years largely due to the discovery of new materials and the discovery of new methods of making better materials. These advances have led to new device applications for semiconducting materials and such applications often require different fabrication techniques. Typically, these techniques are aimed toward obtaining smaller size, more precise location of various geometrical features in the device, more accurate shapes for various geometrical features in the structure, greater adherence of metallic substances to the semiconductor surfaces, etc.

A particular case in point is the development of semiconductor devices involving indium phosphide and related compounds such as indium gallium arsenide phosphide and indium gallium arsenide. Typical devices are photodetectors, light-emitting diodes and semiconductor lasers. Generally, such devices operate at longer wavelengths than traditional III-V devices. Typical wavelengths for indium phosphide type devices are in the range from 0.8 microns to 2.0 microns, most particularly around 1.3 microns.

In fabricating such devices, it would be highly advantageous to have an etching procedure which can be controlled as to etch rate, area to be etched and geometrical shape to be etched. Such an etching procedure is usually referred to as an anisotropic etching procedure. Such a procedure would be useful for making channels, via holes, mirrors, lenses, diffraction gratings and in the separation of individual chips on a semiconductor wafer.

Photoetching has been carried out on n-type indium phosphide using ferric chloride solution (see D. Lubzens, *Electronics Letters*, 13, page 171 (1977)).

SUMMARY OF THE INVENTION

The invention is a photoelectrochemical etching procedure for n-type indium phosphide and related semiconductor compounds such as n-type indium gallium arsenide phosphide and n-type indium gallium arsenide. Included in the semiconductor compounds of interest are those compounds containing at least 50 mole percent indium. The process involves irradiating the area to be etched with light while the semiconductor is in contact with an aqueous electrolyte solution containing an oxidizing agent and a solvating agent (often acid or base) capable of dissolving the products of the oxidation process. The oxidizing agent should have a reduction potential in the actual electrolyte solution between the potential of the Fermi level under flat band conditions and the potential of the valence band maximum. All potentials are with reference to the same electrochemical scale, e.g., the hydrogen scale. In n-type semiconductors, the flat band Fermi potential is generally close to the potential of the conduction band minimum. Use of such oxidizing agents ensures oxidation of the semiconductor in the presence of light without excessive oxidation in the absence of light. The electrolyte should also be capable of dissolving the oxidation products (i.e., indium oxide and phosphorous oxide) of the reaction as well as any products formed between the oxidizing agent and the oxidation products (i.e., phosphates, etc.). Typical oxidation agents for acid solution are pentavalent vanadium (e.g., $NaVO_3$), hexavalent chromium (e.g., $CrO_3$), bromine in water and tetravalent iridium (e.g., $IrCl_6^{-2}$). Hydrochloric acid is a particularly convenient acidifying agent because the chloride ion helps dissolve the indium oxidation product.

The products of the oxidation can often be kept in solution by adjustment of the pH to below 4 or above 8. A particularly convenient system is aqueous HCL with $CrO_3$ as oxidizing agent. This procedure yields excellent anisotropic etching with minimum of etching in dark (unilluminated) areas. This procedure is particularly advantageous when used with a mask to make straight-sided holes and channels without the usual facets caused by isotropic etching procedures.

DETAILED DESCRIPTION

Figure 1:
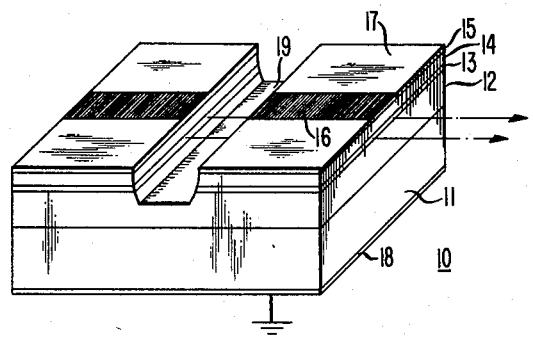
FIG. 1 shows a side view of a laser structure with various materials including n-type InP and InGaAsP advantageously made in accordance with the invention.

The invention is a photoelectrochemical procedure for etching n-type indium phosphide and related compounds such as n-type indium gallium arsenide phosphide and n-type indium phosphide arsenide. Generally, related indium phosphide compound semiconductors are those with at least approximately 50 mole percent indium with or without any phosphorus. Particularly important, in addition to indium phosphide itself, is the mixed compound semiconductor $Ga_xIn_{1-x}As_yP_{1-y}$ with x ranging from zero to 0.47 and y ranging from zero to one. For many applications, it is desirable to lattice match the mixed compound semiconductor to indium phosphide for a particular operational frequency. The procedure for doing this is given by R. E. Nabory et al., *Applied Physics Letters*, 33, page 659 (1978). The range of composition where the bandgap is approximately 1.3 microns and there is close lattice match to InP is particularly important. This composition is where x ranges from 0.27 to 0.31 and y ranges from 0.58 to 0.74.

The compound semiconductor is made n-type by convenient means, including doping with tin, sulfur, tellurium, etc. Generally, the doping range is from $10^{15}$ to $10^{19}$ atoms per cubic centimeter with this range from $10^{17}$ to $10^{18}$ atoms per cubic centimeter preferred for many applications. It should be emphasized that n-type indium phosphide is usually used as a substrate material with the active material, such as the mixed (ternary or quaternary) compound semiconductors such as described above, grown epitaxially on the surface of the substrate material.

The etching procedure is carried out by illuminating the part of the semiconductor surface to be etched with radiation of sufficient energy to ensure the creation of carriers. Generally, the photon energy of at least part of the radiation should be at least as great as the bandgap of the semiconductor. Both monochromatic and broad band radiation sources may be used. In general, the rate of etching depends on the intensity of the radiation incident on the semiconductor surface. This property, together with the direction of radiation, may be used to etch various geometric shapes on the surface of the semiconductor. For example, to etch a straight-walled hole or channel a mask may be used together with parallel rays of radiation to ensure etching straight down into the hole. In addition, variations in the intensity of the radiation over the surface can be used to make various geometric shapes. For example, a lens might be etched by suitable variation of intensity over a radiation spot on the surface of the semiconductor.

The etching procedure is carried out while the area on the semiconductor to be etched is immersed in an electrolytic solution. This solution should contain a suitable oxidizing agent, an agent that ensures dissolution of the oxidation products of the etching procedure and optionally a buffer to stabilize the pH of the solution. Most important is the oxidizing agent which ensures continuity of the oxidation reduction reaction. The oxidizing agent should not be too strong or too weak. For example, it should ensure oxidation in the presence of suitable radiation, but should not lead to excessive oxidation in unradiated portions of the semiconductor. In addition, it is important to avoid oxidizing agents or other reagents in the electrolytic solution which precipitate the oxidation products of the indium phosphide or related semiconductor undergoing the etching procedure. A particular case in point is the avoidance of ferric or ferrous salts which might precipitate on exposure to phosphate ions. This tends to stop the reaction and requires mechanical or chemical removal of the precipitated reagents.

Selection of oxidizing agents suitable for carrying out the process may be made on theoretical grounds, by carrying out certain simple measurements or by a combination of the two approaches. In broad terms, the oxidizing agent should produce etching in the presence of light of suitable energy but (at least ideally) not produce any etching in the absence of light. In addition, the oxidizing agent and its products should be compatible with the etching process.

In an n-type compound semiconductor, the Fermi potential under flat band conditions is quite close to the potential at the minimum of the conduction band (See *Electrochemistry at Semiconductor and Oxidizing Metal Electrodes* by S. Roy Morrison, Plenum Press, New York, 1980, especially chapter 2). For this reason, the criteria for suitable oxidizing agents for n-type material may be put in terms of the potential for the conduction band minimum (here referred to as the conduction band potential) and the potential of the valence band maximum (here referred to as the valence band potential). The oxidizing agent used in the process should have a reduction potential in the actual electrolyte solution between the conduction band potential and the valence band potential. Such an oxidizing agent would produce oxidation in the presence of radiation that created carriers in the valence band but not produce etching in the absence of radiation. Often, precise information on these quantities for different electrolyte solutions and pH values and for different compositions of the compound semiconductors (i.e., ternary and quaternary compounds) is not available. For this reason, theoretical considerations often only give an approximate idea of suitable oxidizing agents.

Roughly, for n-type InP in acid solution (pH less than about 4), the range of reduction potentials for suitable oxidizing agents is from about $-0.1$ to $+0.8$ volts. For the quaternary compounds in acid solution, the range of reduction potentials is from about 0.0 to 0.8 volts and for the ternary compounds, about the same or slightly narrower. Typical oxidizing agents are pentavalent vanadium (e.g., $NaVO_3$), hexavalent chromium (e.g., $CrO_3$), bromine in water and tetravalent iridium (e.g., $IrCl_6^{-2}$). In basic solution, the conduction band potential and the potential at the maximum of the valence band are generally more negative (usually about 50 millivolts per pH unit) so that the selection of oxidizing agent is somewhat different. Typical oxidizing agents are $S^{-2}$ (e.g., $Na_2S$), trivalent cobalt (e.g., $Co(NH_3)_6^{+3}$) and iodate ion (e.g., $NaIO_3$). Even where the potentials are accurately known, the range of permissible reduction potentials for the oxidizing agents is not precisely defined. For example, near the positive limit of the range, there might be more etching in the absence of light than desirable and close to the negative limit, the etch rate might be less than desirable.

A procedure is available for testing the characteristics of a particular oxidizing agent and matching them to the electrochemical properties of a semiconductor in a particular electrolytic solution. This procedure involves taking a voltammogram of the compound semiconductor in the solution of interest with and without light illuminating its surface. A voltammogram is a plot of current against the potential applied to the compound semiconductor with respect to a suitable reference electrode. With radiation, the initial output of current (as the potential on the hydrogen scale is made more and more positive) represents approximately the conduction band potential in that particular electrolytic solution. Without radiation, the initial increase in current is at the valence band potential. The reduction potential of the oxidizing agent in the electrolytic solution to be used in the process should be between these two potentials (the conduction band potential and the valence band potential).

Indeed, where uncertainty exists as to the electrochemical properties of the oxidizing agent a voltammogram can be run on the oxidizing agent in the electrolytic solution of interest. Here, the ideal oxidizing agent should show no reduction current at a potential more positive than the potential at the valence band maximum (where oxidizing current first appeared in the dark in the voltammogram of the compound semiconductor) but show reducing current between the above potential and the conjunction band potential. Such experiments can be done rapidly and easily so as to select suitable oxidizing agents for this process. Also, the shape of the voltammogram and comparison between the voltammogram of the compound semiconductor and oxidizing agent should yield some information about likely etching rates.

Typical concentration ranges for the oxidizing agent are from 0.1 Molar to saturation. Below 0.1 Molar the reaction might tend to be overly slow and frequent replenishment of the solution might be necessary. Preferred concentration ranges are from 0.5 to 1.5 Molar. Lower concentrations tend to yield overly slow etching, whereas higher concentrations sometimes yield etching even in the dark; and such high concentrations are not usually overly beneficial as far as etching rate.

It is also of importance to ensure that the etching product or oxidation product of the indium phosphide dissolves rapidly in the electrolytic solution. This can be accomplished in a number of ways. Certain ions present in the solution (complexing ions, solvating ions) might enhance the rate of solution. Acidic solution (generally pH values less than 4) ensure rapid dissolution of indium phosphorous oxidation products. In addition, the presence of chloride ion ensures rapid dissolution of the indium oxidation products. For this reason, it is preferred that reaction be carried out in aqueous hydrochloric acid with pH less than 4. More preferred is a hydrochloric acid solution with concentration greater than 0.1 Molar. Most preferred is a 1 Molar solution of hydrochloric acid. Dissolution of the oxidation products may also be achieved using highly basic solution, preferably with pH greater than 8. The solution can be made basic in a variety of ways, including the addition of alkali metal hyroxide. The presence of chloride ion is still helpful in dissolving the indium oxide compounds. Generally, the basic solution should not interfere with the oxidation characteristics of the oxidation product.

Reactions take place on two parts of the surface of the semiconductor. The oxidation reaction takes place on the surface of the compound semiconductor that is n-type. This oxidation reaction should only take place in the presence of light. The reduction reaction in which the oxidizing agent is reduced takes place in a part of a semiconductor which is either metallic or p-type. Most conveniently in the fabrication of semiconductor devices this takes place on a metallic mask or coating such as a gold layer attached to the semiconductor surface. Both the region where oxidation takes place and the region where reduction takes place should be immersed in the electrolytic solution.

Various substances may be added to the electrolytic solution so as to lead to more rapid dissolution of the oxidation products of the etching process. These might be various complexing agents as well as the acids or bases mentioned above.

FIG. 1 shows a view in perspective of a semiconductor laser structure 10 grown by liquid phase epitaxy on a substrate 11 of (100) oriented n-type InP. The first layer is a buffer layer 12 of n-type InP (Te doped with a doping level of about $10^{18}$ per cubic centimeter) and an undoped layer 13 of $Ga_xIn_{1-x}As_yP_{1-y}$ with $y=0.62$ and $x=0.29$ (lattice matched to InP with output wavelength about 1.3 microns). On top of the last-mentioned layer is a p-type InP confinement layer 14, zinc doped at a level of about $5 \times 10^{17}$ atoms per square centimeter and a zinc doped p-type layer 15 of $Ga_xIn_{1-x}As_yP_{1-y}$ with $x=0.05$ and $y=0.21$ as a contact layer. The doping level is $5 \times 10^{18}$ atoms per square centimeter. A striped positive electrode 16 is produced on top of the structure (often made of electroplated gold, zinc, gold) and an insulating material 17 (generally $Si_3N_4$) covers the remainder of the top layer. A ground, negative electrode 18 is attached in the form of a metal layer to the bottom surface of the n-type InP substrate. Many of the features of such structures including channels 19 in n-type compound semiconductors are advantageously made in accordance with the invention.

Figure 2:
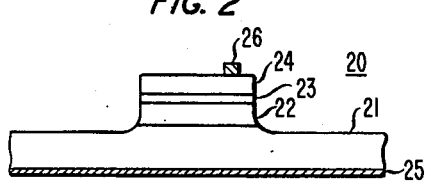
FIG. 2 shows a side view of a possible photodetector using n-type indium phosphide advantageously made in accordance with the invention.

FIG. 2 shows a side view of an indium phosphide photodetector structure 20 with an n-type InP substrate 21 and various layers grown by liquid phase epitaxy. The first epitaxy layer 22 is a buffer layer of n-InP, then an absorbing layer 23 of n-type InGaAsP. The top layer 24 is p-type InP, usually doped with magnesium in the range from $10^{17}$ to $10^{18}$ atoms per cubic centimeter. Electrical contact to the n-type InP is made by means of a Sn-Ni-Au electroplated layer 25 and by an electroplated gold layer 26 for the p-type InP. The shape of the photodetector is called a mesa structure and the n-type compound semiconductors are advantageously etched in accordance with the invention. In addition, separating the individual mesa photodetectors is advantageously carried out by etching the n-type InP substrate between mesa structures in accordance with the invention.

Figure 3:
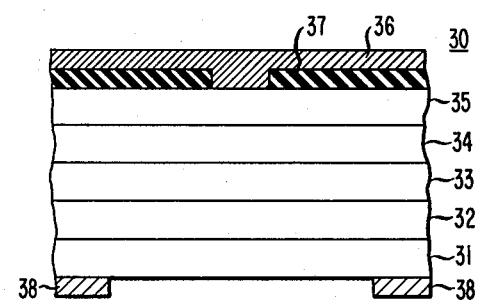
FIG. 3 shows a side view of a light-emitting diode advantageously made in accordance with the invention.

FIG. 3 shows a typical structure for a light-emitting diode 30 active in the 1.3 micron region. The device is made on a substrate 31 made of (100) oriented n-type InP. On this substrate is grown a buffer 32 of n-type InP by liquid phase epitaxy. On top of this layer is grown by the same method an active layer 33 of undoped $In_{0.75}Ga_{0.25}As_{0.54}P_{0.46}$ followed by a confining layer 34 of p-type InP. A further layer 35 of heavily doped p-type InGaAsP is epitaxially grown on the p-InP layer to provide a convenient layer for ohmic contacts. An electrical contact 36 is usually made of gold with or without an adhering layer. The wide gold base acts as a heat sink as well as a place for electrical contact. An insulating layer 37 (typically $SiO_2$) is used to confine the electrical contact to a small area (typically 20-30 micron diameter) at the center of the layer. Another electrical contact layer 38 is attached to the bottom n-InP substrate layer. This electrical contact layer is usually made of gold with or without a binding layer and is in the form of a ring so that the center of the layer is free of metal so that light can exit the device through the center of the layer. Shaping of the device, particularly the n-type InP layers (31 and 32) is advantageously carried out in accordance with the invention. The various metal layers serve as surfaces where reduction takes place to complete the oxidation-reduction process. Particularly advantageous is device separation carried out by etching apart individual LED structures in the semiconductor wafer in accordance with the inventive process.

Figure 4:
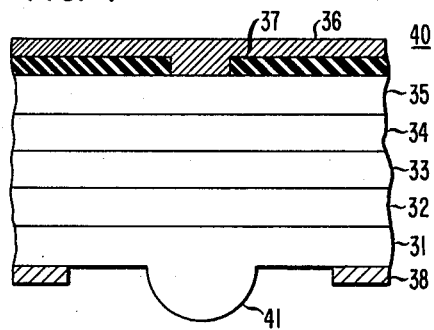
FIG. 4 shows a lens on a light-emitting diode structure advantageously made in accordance with the invention.

FIG. 4 shows a side view of a light-emitting diode (LED) much like the one shown in FIG. 3, except a lens 41 is etched in accordance with the invention. A particular advantage of the invention is that etch rate depends on light intensity so that a lens-shaped structure results from the photoetching process when the light intensity is appropriately varied across the surface being etched.

What is claimed is:
1. A process for fabricating devices comprising at least one n-type III-V compound semiconductor in which the Group III part of the compound semiconductor comprises at least 50 weight percent indium and the process comprises at least one step in which the n-type semiconductor compound is photoelectrochemically etched by an oxidation-reduction reaction in an electrolytic solution characterized in that a. the oxidation is carried out by irradiating the n-type III-V compound semiconductor with radiation comprising photon energy at least as great as the bandgap of the compound semiconductor so as to produce holes that permit oxidation of the compound semiconductor, b. the electrolytic solution comprises oxidizing agent with reduction potential in the electrolytic solution between the potential of the conduction band minimum and the potential of the valence band maximum so that the elements in the n-type III-V compound semiconductor are all oxidized to form oxidation products that are soluble in the electrolytic solution, and c. the oxidizing agent is reduced on a metallic or p-type surface electrically connected to the III-V compound semiconductor.

2. The process of claim 1 in which the III-V compound semiconductor is selected from the group consisting of indium phosphide, indium gallium arsenide and indium gallium arsenide phosphide.

3. The process of claim 2 in which the III-V compound semiconductor has the formula $Ga_xIn_{1-x}As_yP_{1-y}$ in which x ranges from 0.27 to 0.31 and y ranges from 0.58 to 0.74.

4. The process of claim 1 in which the electrolytic solution is acidic.

5. The process of claim 4 in which the electrolytic solution is made acid by the addition of hydrochloric acid.

6. The process of claim 5 in which the reduction potential of the oxidizing agent on the hydrogen scale ranges from $-0.1$ to $+0.8$ volts.

7. The process of claim 6 in which the oxidizing agent is selected from the group consisting of pentavalent vanadium, hexavalent chromium, bromine in water and tetravalent iridium.

8. The process of claim 7 in which the electrolytic solution contains aqueous hydrochloric acid and chromium trioxide.

9. The process of claim 1 in which the oxidizing agent has a concentration between 0.1 Molar and saturation.

10. The process of claim 9 in which the concentration of the oxidizing agent ranges from 0.5 to 1.5 Molar.

11. The process of claim 1 in which the electrolytic solution is basic.

12. The process of claim 11 in which the oxidizing agent is selected from the group consisting of divalent sulfur ion, trivalent cobalt ion and iodate ion.

13. The process of claim 1 in which the radiation is produced by a laser source.

14. The process of claim 1 in which the III-V compound semiconductor is doped with an element selected from the group consisting of tin sulfur and tellurium in the concentration range from $10^{15}$ to $10^{19}$ atoms per cubic centimeter.

15. The process of claim 14 in which the concentration range is from $10^{17}$ to $10^{18}$ atoms per cubic centimeter.

16. A device made by the process of claim 1.

* * * * *